United States Patent
Hsu et al.

(10) Patent No.: US 8,206,158 B2
(45) Date of Patent: Jun. 26, 2012

(54) ELECTRICAL CONNECTOR ASSEMBLY WITH PICK-UP CAP

(75) Inventors: Shuo-Hsiu Hsu, Tu-Cheng (TW); Jia-Hau Liu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 343 days.

(21) Appl. No.: 12/494,327

(22) Filed: Jun. 30, 2009

(65) Prior Publication Data

US 2009/0325409 A1    Dec. 31, 2009

(30) Foreign Application Priority Data

Jun. 30, 2008  (TW) .................................. 97211565

(51) Int. Cl.
*H01R 13/60*    (2006.01)
(52) U.S. Cl. ......................................... 439/41; 439/940
(58) Field of Classification Search ................ 439/41, 439/940, 135, 350
See application file for complete search history.

(56) References Cited

U.S. PATENT DOCUMENTS

| | | | | |
|---|---|---|---|---|
| 4,944,693 A | * | 7/1990 | Puerner | 439/358 |
| 6,309,247 B1 | * | 10/2001 | Wang | 439/521 |
| 6,478,588 B1 | * | 11/2002 | Howell et al. | 439/135 |
| 7,033,188 B2 | * | 4/2006 | Ma | 439/135 |
| 7,530,822 B2 | | 5/2009 | Liao | |

FOREIGN PATENT DOCUMENTS

| | | |
|---|---|---|
| CN | 2609213 | 3/2004 |
| CN | 2629252 | 7/2004 |

* cited by examiner

*Primary Examiner* — Felix O Figueroa
(74) *Attorney, Agent, or Firm* — Wei Te Chung; Andrew C. Cheng; Ming Chieh Chang

(57) ABSTRACT

An electrical connector assembly includes an electrical connector and a pick-up cap assembled to the electrical connector. The electrical connector has an insulative housing defining a substantially rectangular cavity in a middle thereof and a plurality of contacts received in the cavity. The pick-up cap includes a main portion with a planar top surface and a plurality of latching arms extending from two opposite edges of the main portion for engaging with the electrical connector. Each latching arm has an engaging arm extending in a direction for engaging with the electrical connector and a pressing arm extending in an opposite direction. When the pressing arm is pressed inwardly, the engaging arm expands outwardly to release the electrical connector.

3 Claims, 4 Drawing Sheets

ELECTRICAL CONNECTOR ASSEMBLY WITH PICK-UP CAP

BACKGROUND OF THE INVENTION

1. Field of the Invention

The present invention relates to an electrical connector assembly, and more particularly to an electrical connector assembly with a pick-up cap, in which a latching arm thereof is provided with means to protect the latching arm from breaking resulted from excessive deflection.

2. Description of the Prior Art

CN Pat No. 2629252 issued to Ma on Jul. 28, 2004 and CN Pat No. 2609213 issued to Ma et al. on Mar. 31, 2004 both disclose an electrical connector assembly with a pick-up cap. The electrical connector assembly comprises an insulative housing, a plurality of contacts received in the insualtive housing, and a pick-up cap mounted to the insulative housing. The pick-up cap mounted to a top surface of the insulative housing has two main functions: the first is to provide a planar top surface for readily picking up by a vacuum nozzle of a vacuum device, and then to place the electrical connector assembly onto a printed circuit board; the second function is to use the top surface as a protecting cover for preventing dust and other contamination from coming into the insulative housing to pollute the contacts thereof.

U.S. Pat. No. 7,530,822 issued to Liao on May 12, 2009 discloses another electrical connector assembly with a pick-up cap mounted to an insulative housing of the electrical connector assembly. The pick-up cap includes a body portion having four edges. Each edge of the body portion has a pair of latching arms extending horizontally along corresponding edge thereof and then extending downwardly. The insulative housing defines four pairs of recesses to engage with the latching arms. When the pick-up cap is assembled to the insulative housing by an operator, the latching arms of the pick-up cap has to be firstly moved outwardly and slide downwardly into the recesses of the insulative housing. Sometimes the operator may make mistake, such as exerting an excessive force to the pick-up cap, during assembling the pick-up cap to the insulative housing, that may result in deflection or damage of the latching arms.

Therefore, it is need to find a new electrical connector assembly having an improved pick-up cap to overcome the problems mentioned above.

SUMMARY OF THE INVENTION

Accordingly, an object of the present invention is to provide an electrical connector assembly with a pick-up cap, and the pick-up cap has a latching arm which will not be broken down by an outside force.

In order to achieve the object set forth, an electrical connector assembly comprises an electrical connector and a pick-up cap assembled to the electrical connector. The electrical connector has an insulative housing defining a substantially rectangular cavity in a middle thereof and a plurality of contacts received in the cavity. The pick-up cap comprises a main portion with a planar top surface, a plurality of latching arms extending from two opposite edges of the main portion for engaging with the electrical connector, and a plurality of linking portions linking the main portion and the latching arms. Each latching arm has an engaging arm extending from the linking portion along a direction and a pressing arm extending from the linking portion along an opposite direction. When the pressing arm is pressed inwardly, the engaging arm is expanded outwardly.

In order to further achieve the object set forth, an electrical connector assembly comprises an electrical connector and a pick-up cap. The electrical connector includes an insulative housing defining a base. The pick-up cap comprises a main portion with a planar top surface and a plurality of latching arms engaging with the electrical connector. Each latching arm has a first end and an opposite second end engaging with the electrical connector. When remove the pick-up cap from the electrical connector, an horizontal force exerted on the first end of the latching arm to press the first end inwardly and release an engaging force between of the second end of the pick-up cap and the electrical connector.

DESCRIPTION OF PREFERRED EMBODIMENT

Reference will now be made to the drawings to describe the present invention in detail.

Figure 1:
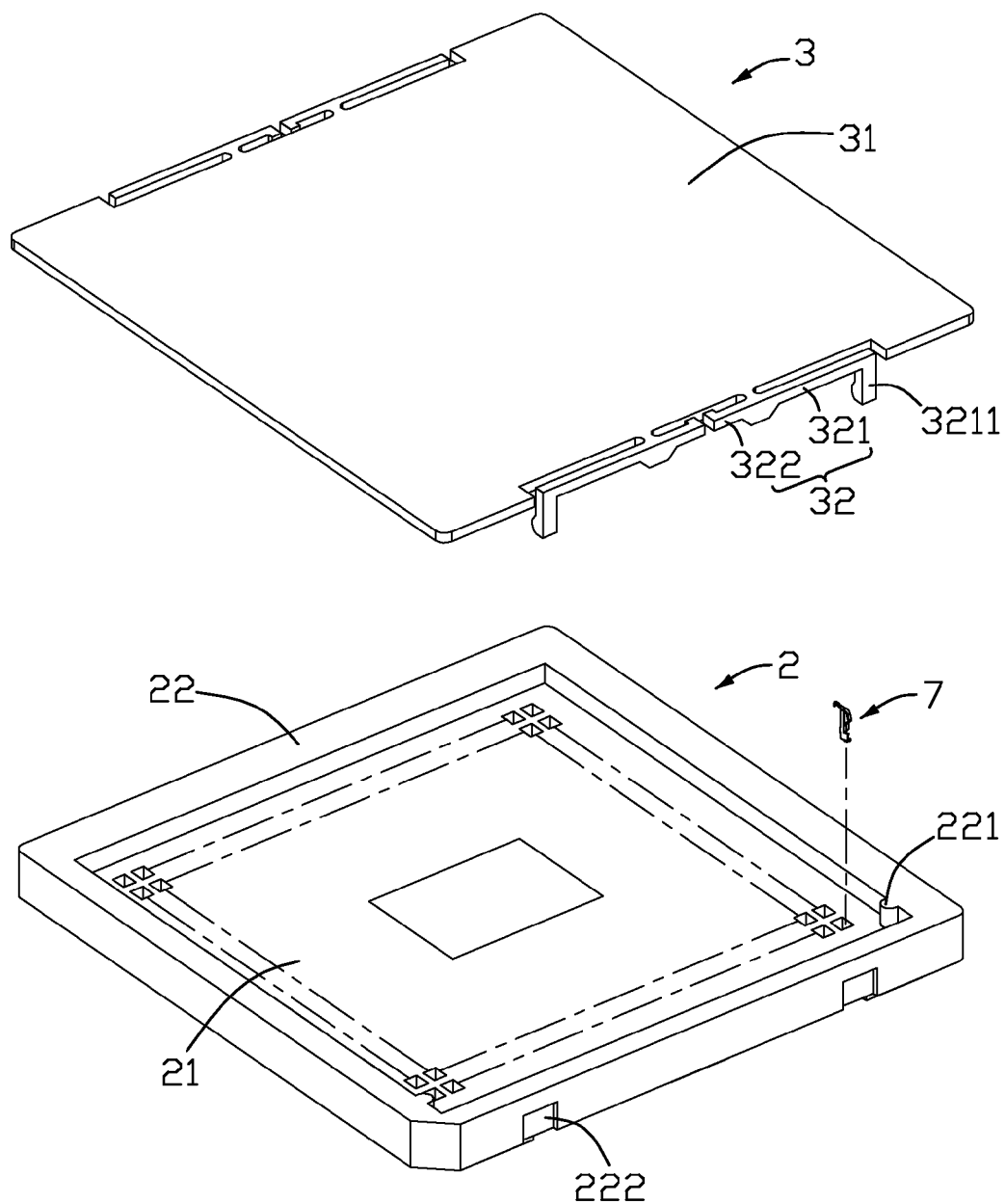
FIG. 1 is an exploded perspective view of an electrical connector assembly according to the present invention.
Figure 2:
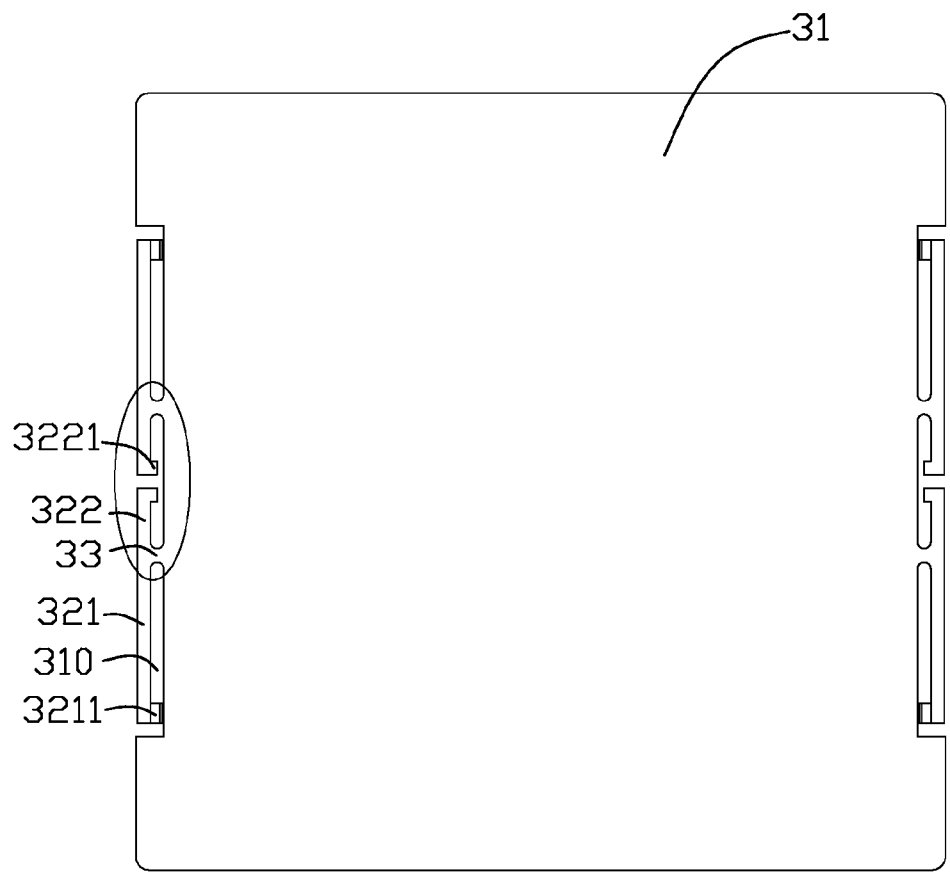
FIG. 2 is a top view of a pick-up cap of the electrical connector assembly of FIG. 1.

FIG. 1 and FIG. 2 show an electrical connector assembly for electrically connecting a printed circuit board (not shown) to an electronic package (not shown). The electrical connector assembly comprises an electrical connector and a pick-up cap 3 assembled to the electrical connector.

The electrical connector includes an insulative housing 2 and a plurality of contacts 7 received in the insulative housing 2. The insulative housing 2 is formed with a rectangular configuration and molded from resin or the like. The insulative housing 2 comprises a base 21 and a plurality of periphery walls 22 extending upwardly from the base 21. The base 21 and the periphery walls 22 define a cavity 23 to receive the electronic package (not shown). The base 21 defines a plurality of passageways (not shown) for receiving the contacts 7. A pair of keys 221 are disposed on inside walls of the periphery walls 22 and located at opposite sides of the cavity 23 for correctly orientating the electronic package (not shown). A plurality of recesses 222 are defined on outside walls of the periphery walls 22.

The pick-up cap 3 is mounted to the insulative housing 2 and is substantially rectangular. The pick-up cap 3 includes a main portion 31 with a planar top surface picked up by a vacuum nozzle (not shown) for disposing the electrical connector assembly onto the printed circuit board (not shown). The main portion 31 has two recesses 310 at opposite edges thereof. Each recess 310 receives a pair of latching arms 32. Each latching arm 32 extends along corresponding edge of the pick-up cap 3 and connects with the main portion 31 by a linking portion 33. Each latching arm 32 includes an engaging arm 321 extending from the linking portion 33 and a pressing arm 322 extending from the linking portion 33 along a direction opposite to an extending direction of the engaging arm 321. The engaging portion 321 comprises a hook 3211 extending downwardly to engage with the recess 222 of the insulative housing 2 to assemble the pick-up cap 3 to the electrical connector. A free end of the pressing arm 322 has a protrusion 3221 extending vertically to the pressing arm 322 and toward the main portion 31. In the present embodiment, the pressing arms 322 of the two latching arms 32 in a same recess 310 are located adjacent to each other for providing a pressing area (see the loop of FIG. 2) for being pressed by a finger of an operator.

Figure 3:
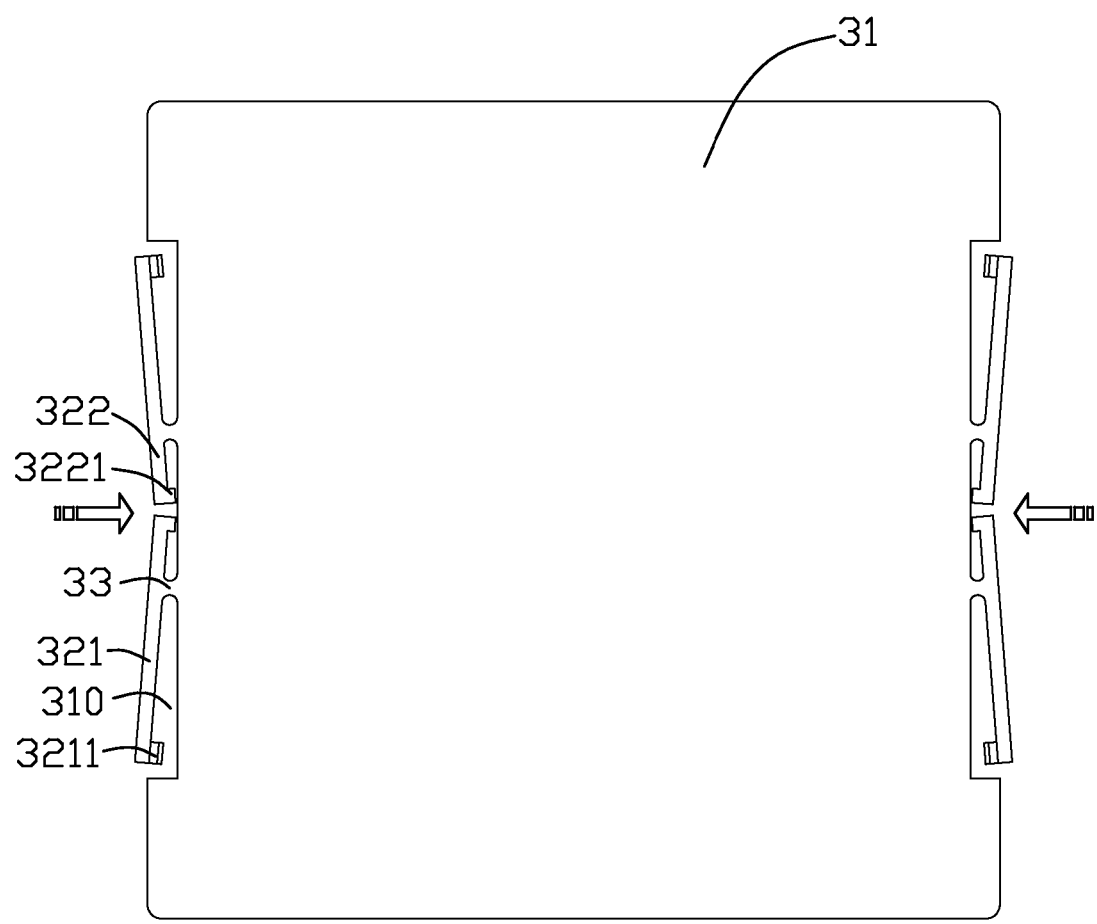
FIG. 3 is a top view of the pick-up cap of FIG. 2, showing the pick-up cap deformed by an exterior force.

Referring to FIG. 3, shown the pick-up cap 3 is removed from the electrical connector. When the pick-up cap 3 is removed from the electrical connector, press the pressing arms 322 of the two sides of the main portion 31 by a thumb and a forefinger of the operator, then a horizontal force is exerted on the pressing arms 322 to push the pressing arms 322 inwardly, so that the engaging arms 321 expand outwardly, and an engaging force between the pick-up cap 3 and the electrical connector is released, at that time, the pick-up cap 3 can be easily removed from the electrical connector.

The working principle of the latching arm 32 is like lever principle. The engaging arm 321 and the pressing arm 322 are located at the two ends of the lever, and the linking portion 33 is served as a fulcrum, when one end is moved downwardly, the other end is moved upwardly. When exerting a horizontal force to the pressing arm 322, the protrusion 3221 may abut against corresponding side walls of the main portion 31 to prevent the pick-up cap 3 from being broken resulted from excessive force.

Figure 4:
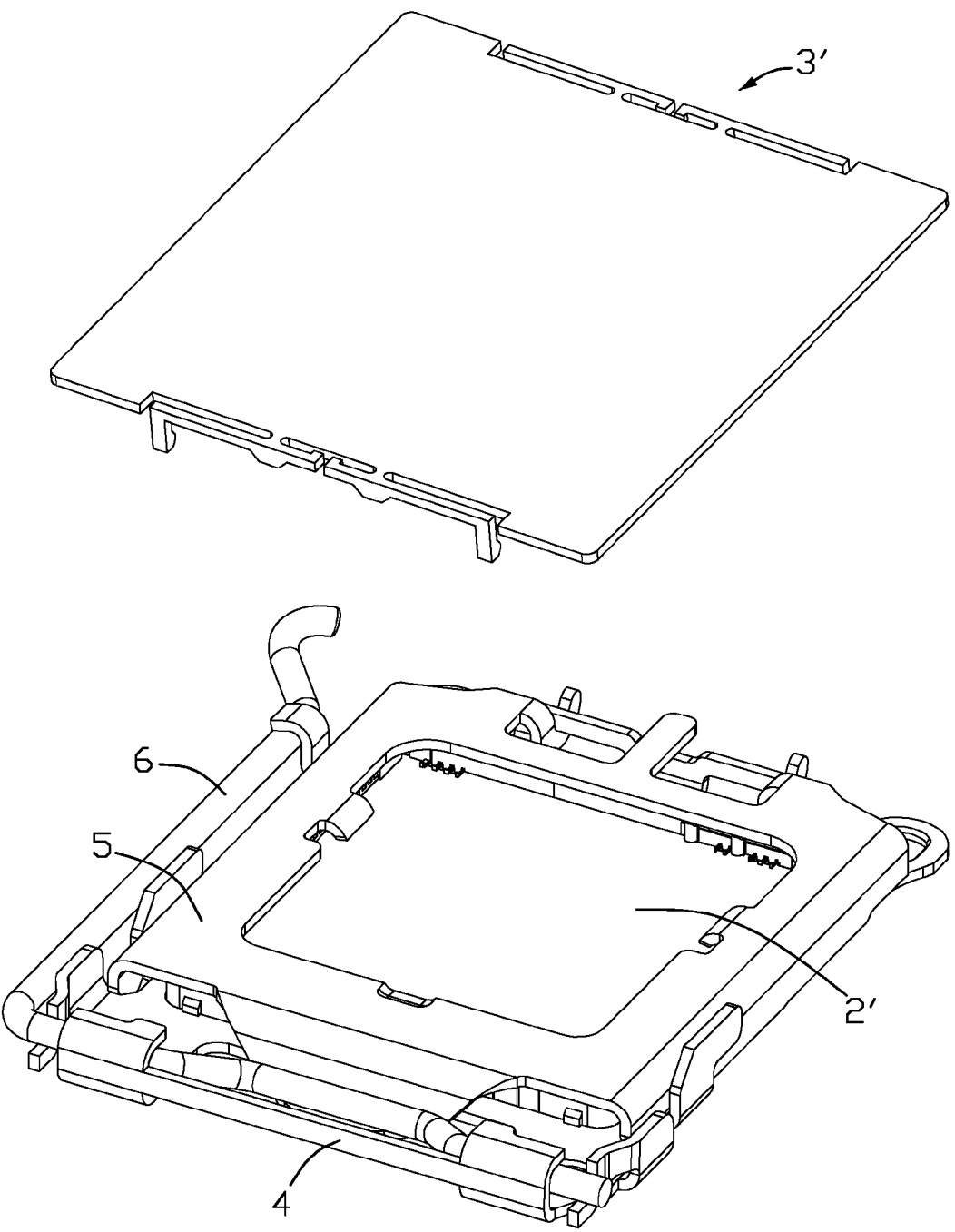
FIG. 4 is an exploded perspective view of another electrical connector assembly in according to the present invention.

FIG. 4 shows another embodiment of the present invention. In this embodiment, the electrical connector comprises a stiffener 4 around an insulative housing 2', a load plate 5 mounted to one end of the stiffener 4, a lever 6 mounted to the other end of the stiffener 4 and a pick-up cap 3'. The pick-up cap 3' is engaged with the load plate 5 and covers a top surface of the load plate 5 to avoid polluting the contacts in the insulative housing 2'.

In the present invention, the pick-up 3 is engaged with the electrical connector, but is not limited to engage with the insulative housing 2 and the load plate 5.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
    an electrical connector defining an upper face; and
    a pick up cap mounted upon the upper face with a main portion equipped with a latch which is deflectable in a horizontal plane and defines a fixed fulcrum section with a hook at one free end for latching to the connector in a direction perpendicular to said horizontal plane; wherein
    said latch is further equipped with an engagement section which is opposite to the hook with regard to the fixed fulcrum section and free from both the connector or main portion of the pick up cap while is engaged at least one of said connector and main portion of the pick up cap so as to prevent over-deflection of the latch during loading/unloading the pick up cap with regard to the connector.

2. The electrical connector assembly as claimed in claim 1, wherein said engagement section and the hook are located on opposite sides of said fulcrum section along a longitudinal direction of said latch.

3. The electrical connector assembly as claimed in 1, wherein said hook is farther from the fulcrum than said engagement section is.

* * * * *